(12) United States Patent
Jiang et al.

(10) Patent No.: US 7,210,819 B2
(45) Date of Patent: *May 1, 2007

(54) LIGHT EMITTING DIODES FOR HIGH AC VOLTAGE OPERATION AND GENERAL LIGHTING

(75) Inventors: Hongxing Jiang, Manhattan, KS (US); Jingyu Lin, Manhattan, KS (US); Sixuan Jin, Manhattan, KS (US)

(73) Assignee: AC LED Lighting L.L.C., Manhattan, KS (US)

( * ) Notice: Subject to any disclaimer, the term of this patent is extended or adjusted under 35 U.S.C. 154(b) by 80 days.

This patent is subject to a terminal disclaimer.

(21) Appl. No.: 11/109,602

(22) Filed: Apr. 19, 2005

(65) Prior Publication Data

US 2005/0185401 A1 Aug. 25, 2005

Related U.S. Application Data

(63) Continuation of application No. 10/279,296, filed on Oct. 24, 2002, now Pat. No. 6,957,899.

(51) Int. Cl.
*F21S 13/14* (2006.01)

(52) U.S. Cl. ............... 362/252; 362/800; 313/500; 257/88; 315/193

(58) Field of Classification Search ........... 362/252, 362/545, 800; 313/500; 257/88, 93; 315/185 R, 315/193; 428/195.1
See application file for complete search history.

(56) References Cited

U.S. PATENT DOCUMENTS

| | | | |
|---|---|---|---|
| 3,900,863 A | 8/1975 | Kim | |
| 5,278,432 A | 1/1994 | Ignatious et al. | |
| 5,317,170 A | 5/1994 | Paoli | |
| 5,563,422 A | 10/1996 | Nakamura et al. | |
| 5,652,434 A | 7/1997 | Nakamura et al. | |
| 5,699,073 A | 12/1997 | Lebby et al. | |
| 5,767,581 A | 6/1998 | Nakamura et al. | |
| 5,773,130 A | 6/1998 | So et al. | |
| 5,786,244 A | 7/1998 | Chang | |
| 5,877,558 A | 3/1999 | Nakamura et al. | |
| 5,929,466 A | 7/1999 | Ohba et al. | |

(Continued)

OTHER PUBLICATIONS

S X Jin, J Li, J Y Lin and H X Jiang, InGaN/GaN Quantum Well Interconnected Microdisk Light Emitting Diodes; Applied Physics Letters, vol. 77, No. 20, p. 3236-3238, Nov. 13, 2000.

(Continued)

*Primary Examiner*—Stephen F Husar
(74) *Attorney, Agent, or Firm*—Lathrop & Gage LC

(57) ABSTRACT

A single-chip integrated LED particularly adapted for direct use with a high voltage AC power comprises a plurality of series-connected LEDs arranged in two arrays. The opposite polarities of the arrays are connected together and then connected to the AC power source. During the positive half of the AC cycle, one array of LEDs is forward biased and energized, while the other array is reverse biased. During the negative half of the AC cycle, the other array of LEDs is forward biased and thus energized, while the first array is reverse biased and thus not energized. The arrays are alternately energized and de-energized at the frequency of the AC power source, and thus the single-chip integrated LED always appears to be energized.

51 Claims, 2 Drawing Sheets

U.S. PATENT DOCUMENTS

| | | |
|---|---|---|
| 5,952,680 A | 9/1999 | Strite |
| 5,955,748 A | 9/1999 | Nakamura et al. |
| 5,966,393 A | 10/1999 | Hide et al. |
| 6,054,724 A | 4/2000 | Ogihara et al. |
| 6,093,965 A | 7/2000 | Nakamura et al. |
| 6,410,940 B1 | 6/2002 | Jiang et al. |
| 6,455,878 B1 | 9/2002 | Bhat et al. |
| 6,461,019 B1 | 10/2002 | Allen |
| 6,547,249 B2 * | 4/2003 | Collins et al. ............... 257/88 |
| 6,635,902 B1 | 10/2003 | Lin et al. |
| 6,740,960 B1 | 5/2004 | Farnworth et al. |
| 6,936,855 B1 | 8/2005 | Harrah |
| 6,957,899 B2 * | 10/2005 | Jiang et al. ............... 362/252 |
| 7,045,965 B2 | 5/2006 | Li et al. |
| 2001/0038656 A1 | 11/2001 | Takeuchi et al. |
| 2002/0006040 A1 | 1/2002 | Kameda et al. |
| 2002/0043943 A1 | 4/2002 | Menzer et al. |
| 2002/0139995 A1 | 10/2002 | Inoue et al. |
| 2004/0080941 A1 | 4/2004 | Jiang et al. |
| 2004/0129946 A1 | 7/2004 | Nagal et al. |
| 2004/0206970 A1 | 10/2004 | Martin |
| 2005/0127816 A1 | 6/2005 | Sumitani |
| 2005/0253151 A1 | 11/2005 | Sakai et al. |
| 2005/0254243 A1 | 11/2005 | Jiang et al. |
| 2006/0044864 A1 | 3/2006 | Lin et al. |
| 2006/0138443 A1 | 6/2006 | Fan et al. |
| 2006/0163589 A1 | 7/2006 | Fan et al. |
| 2006/0169993 A1 | 8/2006 | Fan et al. |
| 2006/0180818 A1 | 8/2006 | Nagai et al. |
| 2006/0208264 A1 | 9/2006 | Ryu et al. |

OTHER PUBLICATIONS

Mair et al., Optical properties of GaN/AlGaN multiple quantum well microdisks, Nov. 17, 1997, Appl. Phys. Lett. 76 (5) p. 631, American Institute of Physics.

Jiang and Lin; Advances In iii-Nitride Micro-size light Emitters; Advanced Semiconductor Magazine; vol. 14, No. 5.

Chen, Chang, Chen, Fann, Jiang, and Lin; Mechanism of Photoluminescence in GaN/Al (0.2)Ga(0.8)N Superlattices; Applied Physics Letters, vol. 79, No. 23; Dec. 3, 2001.

Jiang and Lin; On Display; OE Magazine Jul. 2001.

Dr. Jing Li; III-Nitride Integrated Photonic Devices (undated).

Kansas Researches Fabricate Blue Micro Light-Emitting Diodes, Paving Way for Microdisplays, Energy Saving Lighting; Ascribe The Public Interest Newswire, Sep. 27, 2001.

C. W Jeon, H.W. Choi and M.D. Dawson; A Novel Fabrication Method For A 64 ×64 Matrix-Addressable GaN-Based Micro-LED Array; Phys. Stat. Sol. (a) No. 1, pp. 78-82, 2003.

Zhaoyang Fan, Hongxing Jiang, Jingyu Lin; Related and Copending U.S. Appl. No. 11/144,982, filed Jun. 3, 2005.

Zhaoyang Fan; Related and Copending U.S. Appl. No. 11/340,296, filed Jan. 26, 2006.

* cited by examiner

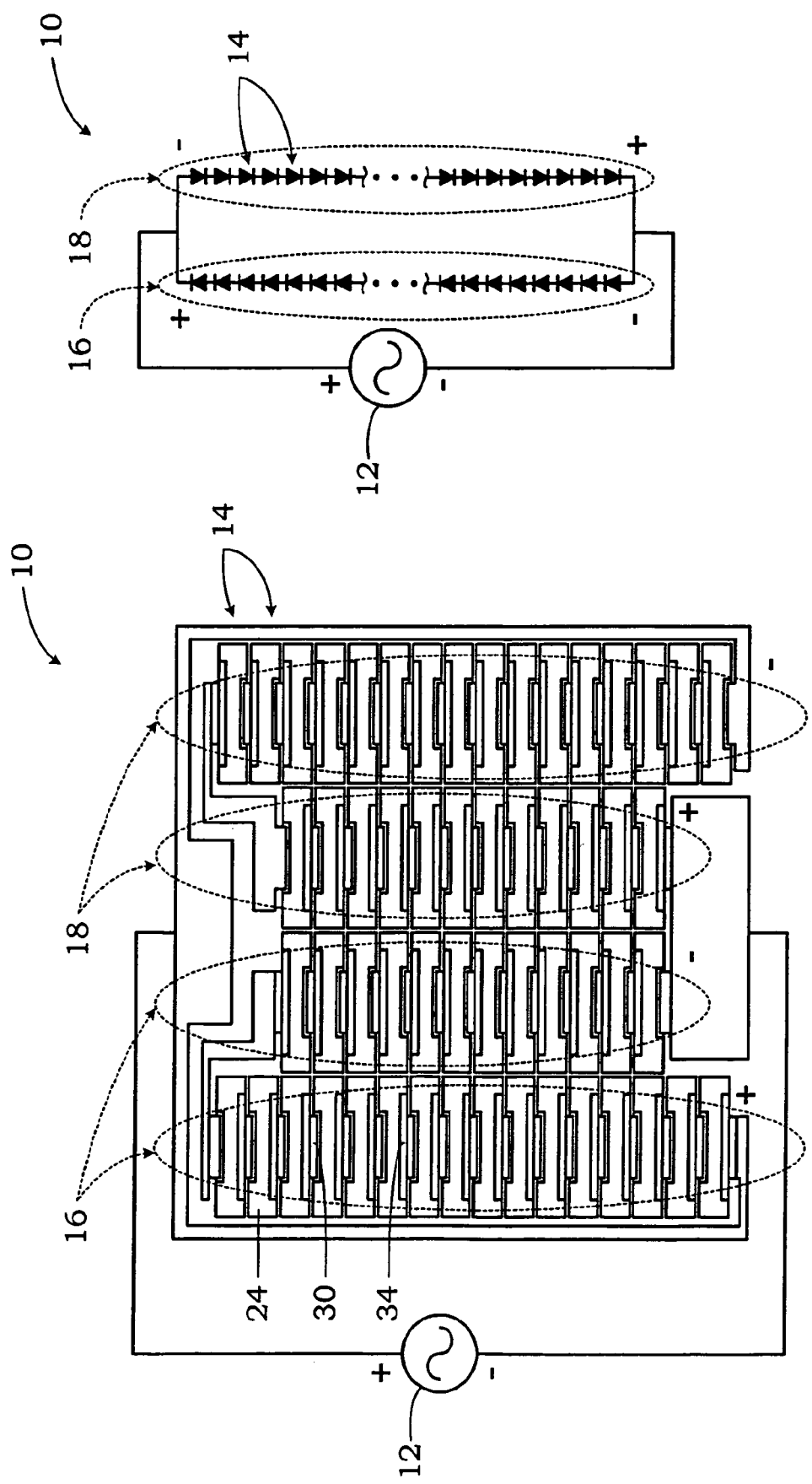

LIGHT EMITTING DIODES FOR HIGH AC VOLTAGE OPERATION AND GENERAL LIGHTING

CROSS-REFERENCE TO RELATED APPLICATION

The present application is a continuation application of Ser. No. 10/279,296, filed Oct. 24, 2002 now U.S. Pat. No. 6,957,899, which is hereby incorporated into the present application by reference.

BACKGROUND OF THE INVENTION

The present invention relates to single-chip light emitting diodes (LED), and more particularly to single-chip LEDs which can operate under standard alternating-current (AC) high voltage (110V, 220V, etc.) conditions for various applications, including general lighting.

LEDs are used in displays, as indicator lights, for traffic lights, for communications, and for optical interconnects. With the realization of high brightness blue/green and violet LEDs made from the III-nitride semiconductor family InN, GaN, AlN and their alloys recently it is now possible that LEDs may be used for general lighting applications in residential houses and commercial buildings. LEDs have already found niche applications in the area of lighting, such as passenger side reading lights in vehicles. Because of the potential energy, environment and national security benefits, there is increasing national interest in creating a partnership—of industry, universities and national laboratories—aimed at accelerating the development of Solid-State Lighting science and technology. A nation-wide program called "Next-Generation Lighting Initiative" has been lunched by the Department of Energy (DOE).

Several methods have been proposed and employed to achieve white light emission from LEDs. The first and the only commercial product is to use blue LEDs made of M-nitrides to generate white light by coating the blue LED chips with yellow phosphors. Phosphors down convert part of the shorter wavelength blue light to a yellow wavelength visible yellow light. Through color mixing, the eye sees white when two colors are properly balanced. Other proposed method includes using UV LEDs (more efficient sources) to pump three-color phosphors (red, blue, green, RBG) or to combine three color (RBG) LEDs to get white emission.

Currently, all semiconductor LEDs are DC operated with typical operating voltages of a few volts (e.g., around 2 volts for Red LEDs and around 3.5 volts for blue LEDs). However, substantially all the houses and buildings in North America are wired with AC (60 Hz) 110 volts power sources. One way to use LEDs for general lighting applications is to convert AC 110 V to DC with a low voltage. This requires the use of power converters, which may be installed separately or built into the LED package. This approach has been utilized in LED traffic signal lights. Use of power converters have disadvantages such as added volume, added costs, and low efficiency, for example.

There is also a method for achieving AC operation of LEDs by wiring two discrete LEDs connected opposite of one another (the cathode of one goes to the anode of the other). When the LEDs are connected to a low voltage AC circuit, both LEDs glow alternately; one LED is biased by positive voltage side of the AC cycle (forward biased), and the other LED is biased by the negative voltage side of the AC cycle (reverse biased). Since the AC source usually runs at 60 Hz both LEDs appear to be always on to the naked eye. However, there are no new technologies involved in this type of "AC-LEDs" by ganging together a strand of LEDs and they are not suitable for lighting applications. To achieve high voltage AC operations, one needs to connect a few dozens of LEDs in a similar fashion. Hence, it would not be viable economically or physically to replace an incandescent lamp by a strand of discrete of LEDs.

A need remains in the art for single-chip LEDs for standard high AC voltage (110 volts or 220 volts) operations. A need also remains in the art for integrated semiconductors optical components on a single chip; in this case it involves the integration of many LEDs.

SUMMARY OF THE INVENTION

The present invention provides single-chip LEDs through the use of integrated circuit technology, which can be used for standard high AC voltage (110 volts for North America, and 220 volts for Europe, Asia, etc.) operation. The single-chip AC LED integrates many smaller LEDs, which are connected in series. The integration is done during the LED fabrication process and the final product is a single-chip device that can be plugged directly into house or building power outlets or directly screwed into incandescent lamp sockets that are powered by standard high AC voltages. The series connected smaller LEDs are patterned by photolithography, etching (such as plasma dry etching), and metallization on a single chip. The electrical insulation between small LEDs within a single-chip is achieved by etching light emitting materials into the insulating substrate so that no light emitting material is present between small LEDs. The voltage crossing each one of the small LEDs is about the same as that in a conventional DC operating LED fabricated from the same type of material (e.g., about 3.5 volts for blue LEDs). To account for the difference between the AC and DC current, two columns of series-connected mini-LEDs are wired in opposite polarities. At one instant, all the mini-LEDs in one of the columns are forward biased and hence are all turned-on, while the mini-LEDs in the other column are all reverse biased and hence are all turned off. However, the AC current turns on and off these two columns alternately. Since the frequency of AC power supply is 60 Hz (or 50 Hz) all these small LEDs within the single-chip appear to be on all the time to the naked eye.

BRIEF DESCRIPTION OF THE DRAWINGS

FIG. 1 is a diagrammatic plan view of a single-chip high voltage AC LED of the present invention.

FIG. 2 is an equivalent circuit of the single-chip high voltage AC LED of FIG. 1.

DETAILED DESCRIPTION OF THE PREFERRED EMBODIMENT

Figure 3:
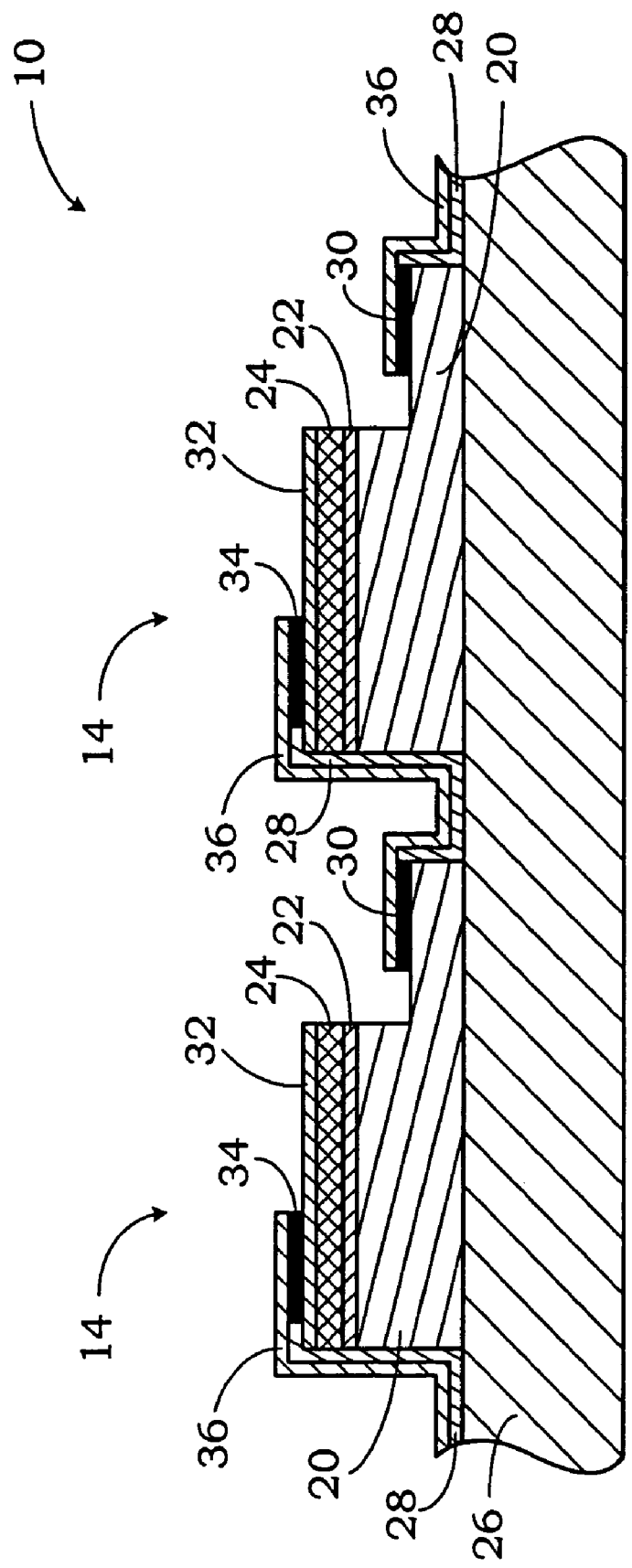
FIG. 3 is a diagrammatic cross sectional illustration showing integration between adjacent LED elements within the single-chip high voltage AC LED.

Referring to FIG. 1, a single-chip high voltage AC LED 10 is illustrated connected to a high voltage AC power supply 12. As shown, the single-chip high voltage AC LED 10 effectively consists of two arrays of series-connected individual smaller LEDs 14. The two arrays of series-connected individual LEDs are then connected to the opposite polarities of the high voltage AC power source 12. Each LED array could be made into one or many columns to fit the desired geometrical shape of the single-chip high voltage LED. In FIG. 1, each array consists of two columns for illustration.

Referring to FIGS. 1 and 2, the first array 16 of the single-chip AC LED 10 provides a number of series-connected smaller LEDs 14. The cathode of one LED 14 is connected to the anode of the next LED to form the array 16. The array 16 of LEDs 14 presents a positive terminal corresponding to the cathode of the last LED (shown at the bottom of the first column of array 16 in FIG. 1 and shown at the top of array 16 in FIG. 2), and a negative terminal corresponding to the anode of the first LED (shown at the bottom of the second column of array 16 in FIG. 1 and shown at the bottom of the array 16 in FIG. 2). The second array 18 of the single-chip AC LED 10 provides an equal number of series-connected smaller LEDs 14. The cathode of one LED 14 is connected to the anode of the next LED to form the array 18. The array 18 of LEDs 14 also presents positive and negative terminals, which are connected to the opposite terminal of array 16. When the AC cycle is positive, the LEDs 14 of array 16 are forward biased and thus energized. At the same time, the LEDs 14 of array 18 are reverse biased, and hence turned off. When the AC cycle is negative, the LEDs 14 of array 16 are reverse biased and hence turned off, while the LEDs 14 of array 18 are forward biased and thus turned on.

The arrays 16 and 18 are connected to different polarities of the AC power source for high voltage AC operation. The arrays 16 and 18 of smaller LEDs 14 are alternatively turned on and off at a rate corresponding to the frequency of the AC source. Common frequencies for public utilities are 60 Hz or 50 Hz, for example. Thus for a 60 Hz AC power source, arrays 16 and 18 are alternatively energized at a 60 Hz rate. In this manner, to the naked eye, the single-chip high voltage AC LED 10 always appears to be on.

The number of series-connected smaller LEDs 14 in each array 16 and 18 depends on the operating voltage of the individual LEDs 14. The operating voltage of an LED depends on the type of the LED, which is around 2 volts for red LED and around 3.5 volts for blue LEDs. The typical variation in the operating voltage among individual smaller LEDs may be approximately 0.1–0.3 V depending on the type and manufacturer of the LED. For example, using LEDs having a typical operating voltage of 4.0 volts, the number of the LEDs "n" in each array 16 and 18 is approximately 28 for a 110 volt AC power source 12.

For a 220 volt AC application, as is commonly used in European and Asian countries, for example, approximately 55 LEDs would be integrated into each array. Thus, the number of LEDs is dependent on the voltage characteristics of the LEDs used or formed on the single-chip, and the application voltage of 110 volts AC or 220 volts AC. For a forward voltage of 3.5 volts for an individual LED 14, for example, the number of LEDs "n" in each column 16 and 18 is approximately 31 for a 110 volt AC power source. The number of LEDs is dependent on the voltage characteristics of the type of LED used. For example, the forward voltage for a red LED may be approximately 2 volts and 3 to 4 volts for a blue LED. If the AC voltage is 220 volts, the number of LEDs in the columns 16 and 18 will be approximately double that of the 110 volt application.

Referring to FIG. 3, a diagrammatic cross-sectional view of the single-chip AC high voltage LED 10 is illustrated showing the details of integration and connection of two adjacent smaller LEDs 14. The single-chip AC LED 10 is formed by depositing layers of n-type semiconductor material 20, optically active layers 22 and p-type semiconductor material 24 in succession on an insulating substrate 26. In FIG. 3, n-type gallium nitride (n-GaN) 20, indium gallium nitride/gallium nitride multiple quantum wells (InGaN/GaN MQW) optically active layers 22 and p-type gallium nitride (p-GaN) 24 in succession on a sapphire substrate 26 are being used as an illustration. Substrate 26 may be made of an insulating material as shown in FIG. 3 or may be a layer of insulating film deposited on a conducting substrate or other material.

The electrical insulation between the two adjacent LEDs 14 is accomplished by etching (dry or wet chemical etching) into the insulating substrate 26 so that no light emitting material is present between the two LEDs 14. An insulating film 28 such as silicone dioxide ($SiO_2$) is subsequently deposited on the etched surface 26. An n-type ohmic contact 30 is deposited on the exposed n-type layer 20. A transparent p-type metal film 32 is deposited on the p-type layer 24 upon which a p-type ohmic contact 34 is deposited. A conductive layer 36 connects the n-type ohmic contact 30 of one LED 14 to the p-type ohmic contact 34 of the next LED 14.

It should be understood that p-n junction, heterojunction, multiple quantum well, organic electro-luminescent and polymer electro-luminescent LEDs as well as other types light emitting diodes may be configured as described hereinabove or in other combinations. Additionally, LEDs may be configured for 110-volt operation and 220-volt operation using switches. When configured for 110-volt operation, the arrays 16 and 18 may be connected as described hereinabove. Using a pair of switches, the 110-volt configuration may be converted to 220-volt operation wherein both arrays are series-connected and forward biased simultaneously. In this way, all of the LEDs are energized or on for half of the AC cycle and all of them are off for the other half of the AC cycle.

It should be understood that while a certain form of this invention has been illustrated and described, it is not limited thereto except insofar as such limitations are included in the following claims.

Having thus described the invention, what is claimed as new and desired to be secured by Letters Patent is:

1. A single-chip integrated LED for use with an AC power source comprising:

a first plurality of series connected LEDs having a forward biased direction of current flow, a reverse biased direction of no current flow opposite said forward biased direction of current flow, and presenting positive and negative terminals, a second plurality of series connected LEDs having a forward biased direction of current flow, a reverse biased direction of no current flow opposite said forward biased direction of current flow, and presenting positive and negative terminals, said positive terminal of said first plurality of LEDs connected to said negative terminal of said second plurality of LEDs, said negative terminal of said first plurality of LEDs connected to said positive terminal of said second plurality of LEDs, and said terminals of said first and second plurality of LEDs adapted to be connected across said AC power source, whereby a current from said AC power source energizes said first plurality of LEDs in the forward biased direction during a first half cycle of the AC power source and said current from said AC power source energizes said second plurality of LEDs in the forward biased direction during a second half cycle of the AC power source.

2. The single-chip integrated LED as claimed in claim 1 wherein said AC power source is 110 volts.

3. The single-chip integrated LED as claimed in claim 1 wherein said AC power source is 220 volts.

4. The single-chip integrated LED as claimed in claim 1 wherein said single-chip is fabricated on an insulating substrate material.

5. The single-chip integrated LED as claimed in claim 4 wherein each of said series connected LEDs includes an n-type ohmic contact and a p-type ohmic contact.

6. The single-chip integrated LED as claimed in claim 5 wherein an area between each of said series connected LEDs is etched to said insulating substrate to present an etched surface, an insulating film is deposited on said etched surface and a conducting layer is deposited on said insulating film to connect said n-type ohmic contact of one of said series connected LEDs to said p-type ohmic contact of an adjacent one of said series connected LEDs.

7. The single-chip integrated LED as claimed in claim 1 wherein said single-chip is fabricated on a layer of insulating film which is deposited on a conducting substrate.

8. The single-chip integrated LED as claimed in claim 7 wherein each of said series connected LEDs includes an n-type ohmic contact and a p-type ohmic contact.

9. The single-chip integrated LED as claimed in claim 8 wherein an area between each of said series connected LEDs is etched to said insulating film to present an etched surface, a second insulating film is deposited on said etched surface and a conducting layer is deposited on said second insulating film to connect said n-type ohmic contact of one of said series connected LEDs to said p-type ohmic contact of an adjacent one of said series connected LEDs.

10. The single-chip integrated LED as claimed in claim 1 wherein said plurality of LEDs are LEDs selected from the group consisting of semiconductor p-n junctions, semiconductor heterojunctions, semiconductor quantum wells, organic electro-luminescent materials and polymer electro-luminescent materials.

11. A light source comprising:
a single-chip integrated LED device having a first plurality of series connected LEDs having a forward biased direction of current flow, and a second plurality of series connected LEDs having a forward biased direction of current flow,
said first and second pluralities of LEDs connected together such that said respective forward biased directions of current flow are opposing, and
structure for connecting said first and second pluralities of LEDs across an AC power source,
wherein said first and second pluralities of LEDs are alternatively energized by said AC power source.

12. The light source as set forth in claim 11 wherein said AC power source is 110 volts.

13. The light source as set forth in claim 11 wherein said AC power source is 220 volts.

14. The light source as set forth in claim 11 wherein said single-chip is fabricated on an insulating substrate material.

15. The light source as set forth in claim 14 wherein each of said series connected LEDs includes an n-type ohmic contact and a p-type ohmic contact.

16. The light source as set forth in claim 15 wherein an area between each of said series connected LEDs is etched to said insulating substrate to present an etched surface, an insulating film is deposited on said etched surface and a conducting layer is deposited on said insulating film to connect said n-type ohmic contact of one of said series connected LEDs to said p-type ohmic contact of an adjacent one of said series connected LEDs.

17. The light source as set forth in claim 11 wherein said single-chip is fabricated on a layer of insulating film which is deposited on a conducting substrate.

18. The light source as set forth in claim 17 wherein each of said series connected LEDs includes an n-type ohmic contact and a p-type ohmic contact.

19. The light source as set forth in claim 18 wherein an area between each of said series connected LEDs is etched to said insulating film to present an etched surface, a second insulating film is deposited on said etched surface and a conducting layer is deposited on said second insulating film to connect said n-type ohmic contact of one of said series connected LEDs to said p-type ohmic contact of an adjacent one of said series connected LEDs.

20. The light source as set forth in claim 11 wherein said plurality of LEDs are LEDs selected from the group consisting of semiconductor p-n junctions, semiconductor heterojunctions, semiconductor quantum wells, organic electro-luminescent materials and polymer electro-luminescent materials.

21. A light source comprising:
a single-chip integrated LED device having an array of series-connected LEDs having a forward biased direction of current flow and presenting positive and negative terminals, and
said terminals of said single-chip integrated LED device adapted to be connected across an AC power source,
whereby a current from said AC power source energizes said array of series-connected LEDs in said forward biased direction during a first half cycle of the AC power source cycle.

22. The light source as set forth in claim 21 wherein said single-chip integrated LED device further comprises a second array of series-connected LEDs having a second forward biased direction of current flow and presenting second positive and negative terminals, said second positive terminal of said second array connected to said negative terminal of said array, and said second negative terminal of said second array connected to said positive terminal of said array, whereby said current from said AC power source energizes said second array of series-connected LEDs in said second forward biased direction during a second half cycle of said AC power source cycle.

23. The light source as set forth in claim 21 wherein said AC power source is 110 volts.

24. The light source as set forth in claim 21 wherein said AC power source is 220 volts.

25. The light source as set forth in claim 21 wherein said device integrated LED device is fabricated on an insulating substrate material.

26. The light source as set forth in claim 25 wherein each of said series-connected LEDs includes an n-type ohmic contact and a p-type ohmic contact.

27. The light source as set forth in claim 26 wherein an area between each of said series-connected LEDs is etched to said insulating substrate to present an etched surface, an insulating film is deposited on said etched surface and a conducting layer is deposited on said insulating film to connect said n-type ohmic contact of one of said series-connected LEDs to said p-type ohmic contact of an adjacent one of said series-connected LEDs.

28. The light source as set forth in claim 21 wherein said device is fabricated on a layer of insulating film which is deposited on a conducting substrate.

29. The light source as set forth in claim 28 wherein each of said series-connected LEDs includes an n-type ohmic contact and a p-type ohmic contact.

30. The light source as set forth in claim 29 wherein an area between each of said series-connected LEDs is etched to said insulating film and presenting an etched surface, a second insulating film is deposited on said etched surface and a conducting layer is deposited on said second insulating film to connect said n-type ohmic contact of one of said series-connected LEDs to said p-type ohmic contact of an adjacent series-connected LEDs.

31. The light source as set forth in claim 21 wherein said series-connected LEDs are LEDs selected from the group consisting of semiconductor p-n junctions, semiconductor heterojunctions, semiconductor quantum wells, organic electro-luminescent materials and polymer electro-luminescent materials.

32. A light source comprising:
a single chip integrated LED device having a first plurality of series connected LEDs for flow of current therethrough in a first direction and a second plurality of series connected LEDs for flow of current therethrough in a second direction, and
structure for connecting said first and second pluralities of LEDs across an AC power source for flow of current therethrough alternately in said first and second directions in response to an applied current.

33. The light source as set forth in claim 32 wherein said AC power source is 110 volts.

34. The light source as set forth in claim 32 wherein said AC power source is 220 volts.

35. The light source as set forth in claim 32 wherein said single-chip integrated LED device is fabricated on an insulating substrate material.

36. The light source as set forth in claim 35 wherein each of said series-connected LEDs includes an n-type ohmic contact and a p-type ohmic contact.

37. The light source as set forth in claim 36 wherein an area between each of said series connected LEDs is etched to said insulating substrate to present an etched surface, an insulating film is deposited on said etched surface and a conducting layer is deposited on said insulating film to connect said n-type ohmic contact of one of said series connected LEDs to said p-type ohmic contact of an adjacent one of said series connected LEDs.

38. The light source as set forth in claim 32 wherein said single-chip integrated LED device is fabricated on a layer of insulating film which is deposited on a conducting substrate.

39. The light source as set forth in claim 38 wherein each of said series-connected LEDs includes an n-type ohmic contact and a p-type ohmic contact.

40. The light source as set forth in claim 39 wherein an area between each of said series connected LEDs is etched to said insulating film to present an etched surface, a second insulating film is deposited on said etched surface and a conducting layer is deposited on said second insulating film to connect said n-type ohmic contact of one of said series connected LEDs to said p-type ohmic contact of an adjacent one of said series connected LEDs.

41. The light source as set forth in claim 32 wherein said series connected LEDs are LEDs selected from the group consisting of semiconductor p-n junctions, semiconductor heterojunctions, semiconductor quantum wells, organic electro-luminescent materials and polymer electro-luminescent materials.

42. A light source comprising:
a single-chip integrated device having a plurality of pairs of LEDs, each of said pairs of LEDs having a first LED having a first forward biased direction of current flow and a second LED having a second forward biased direction of current flow, said first LED connected to said second LED opposite said second forward biased direction of current flow, said plurality of pairs of LEDs connected in series,
structure adapted to connect said plurality of pairs of LEDs across an AC power source,
whereby a current from said AC power source energizes said plurality of first LEDs in said first forward biased direction during a first half cycle of the AC power source cycle and said plurality of second LEDs in said second forward biased direction during a second half cycle of the AC power source cycle.

43. The light source as set forth in claim 42 wherein said AC power source is 110 volts.

44. The light source as set forth in claim 42 wherein said AC power source is 220 volts.

45. The light source as set forth in claim 42 wherein said single-chip integrated device is fabricated on an insulating substrate material.

46. The light source as set forth in claim 45 wherein each of said LEDs includes an n-type ohmic contact and a p-type ohmic contact.

47. The light source as set forth in claim 46 wherein an area between each of said LEDs is etched to said insulating substrate to present an etched surface, an insulating film is deposited on said etched surface and a conducting layer is deposited on said insulating film to connect said n-type ohmic contact of said first LED p-type ohmic contact of said second LED, and to connect said n-type ohmic contact of said second LED to said p-type ohmic contact of said first LED.

48. The light source as set forth in claim 42 wherein said single-chip integrated LED device is fabricated on a layer of insulating film which is deposited on a conducting substrate.

49. The light source as set forth in claim 48 wherein each of said LEDs includes an n-type ohmic contact and a p-type ohmic contact.

50. The light source as set forth in claim 49 wherein an area between each of said LEDs is etched to said insulating film to present an etched surface, a second insulating film is deposited on said etched surface and a conducting layer is deposited on said second insulating film to connect said n-type ohmic contact of said first LED p-type ohmic contact of said second LED, and to connect said n-type ohmic contact of said second LED to said p-type ohmic contact of said first LED.

51. The light source as set forth in claim 42 wherein said LEDs are LEDs selected from the group consisting of semiconductor p-n junctions, semiconductor heterojunctions, semiconductor quantum wells, organic electro-luminescent materials and polymer electro-luminescent materials.

* * * * *